(12) United States Patent
Goenka

(10) Patent No.: US 7,788,933 B2
(45) Date of Patent: Sep. 7, 2010

(54) HEAT EXCHANGER TUBE HAVING INTEGRATED THERMOELECTRIC DEVICES

(75) Inventor: Lakhi Nandlal Goenka, Ann Arbor, MI (US)

(73) Assignee: BSST LLC, Irwindale, CA (US)

(*) Notice: Subject to any disclaimer, the term of this patent is extended or adjusted under 35 U.S.C. 154(b) by 203 days.

(21) Appl. No.: 11/497,695

(22) Filed: Aug. 2, 2006

(65) Prior Publication Data

US 2008/0028769 A1 Feb. 7, 2008

(51) Int. Cl.
*F25B 21/02* (2006.01)
(52) U.S. Cl. ........................................ 62/3.7
(58) Field of Classification Search .............. 62/3, 62/3.7, 3.1; 136/203; 165/152, 153, 173; 310/306; 361/700; 417/208; 431/243; 332/2
See application file for complete search history.

(56) References Cited

U.S. PATENT DOCUMENTS

| | | | |
|---|---|---|---|
| 4,047,093 A * | 9/1977 | Levoy | 322/2 R |
| 4,448,028 A | 5/1984 | Chao et al. | |
| 4,634,803 A * | 1/1987 | Mathiprakasam | 136/212 |
| 5,180,293 A * | 1/1993 | Hartl | 417/366 |
| 5,316,078 A | 5/1994 | Cesaroni | |
| 5,385,020 A | 1/1995 | Gwilliam et al. | |
| 5,419,980 A | 5/1995 | Okamoto et al. | |
| 5,431,021 A | 7/1995 | Gwilliam et al. | |
| 5,890,371 A | 4/1999 | Rajasubramanian et al. | |
| 6,119,463 A | 9/2000 | Bell | |
| 6,127,766 A * | 10/2000 | Roidt | 310/306 |
| 6,223,539 B1 | 5/2001 | Bell | |
| 6,270,015 B1 | 8/2001 | Hirota | |
| 6,302,196 B1 * | 10/2001 | Haussmann | 165/153 |
| 6,385,976 B1 | 5/2002 | Yamamura et al. | |
| 6,499,306 B2 | 12/2002 | Gillen | |
| 6,539,725 B2 * | 4/2003 | Bell | 62/3.7 |
| 6,548,750 B1 * | 4/2003 | Picone | 136/203 |
| 6,606,866 B2 | 8/2003 | Bell | |
| 6,625,990 B2 | 9/2003 | Bell | |
| 6,682,844 B2 | 1/2004 | Genc | |
| 6,732,534 B2 | 5/2004 | Spry | |
| 6,779,348 B2 | 8/2004 | Taban | |
| 6,907,739 B2 | 6/2005 | Bell | |
| 6,948,321 B2 | 9/2005 | Bell | |
| 2005/0139692 A1 | 6/2005 | Yamamoto | |
| 2005/0257531 A1 | 11/2005 | Kadle et al. | |
| 2005/0268621 A1 | 12/2005 | Kadle et al. | |
| 2005/0278863 A1 | 12/2005 | Bahash et al. | |
| 2005/0279105 A1 | 12/2005 | Pastorino | |
| 2006/0075758 A1 | 4/2006 | Rice et al. | |

\* cited by examiner

*Primary Examiner*—Frantz F. Jules
*Assistant Examiner*—Emmanuel Duke
(74) *Attorney, Agent, or Firm*—Knobbe Martens Olson & Bear LLP

(57) ABSTRACT

A heat exchanger for a vehicle is shown, wherein the heat exchanger includes a plurality of tubes having integrated thermoelectric devices disposed thereon to facilitate heat transfer between the tubes and an atmosphere surrounding the tubes.

16 Claims, 3 Drawing Sheets

HEAT EXCHANGER TUBE HAVING INTEGRATED THERMOELECTRIC DEVICES

FIELD OF THE INVENTION

The present invention relates to a heat exchanger tube and more particularly to a heat exchanger tube having integrated thermoelectric devices to increase a thermal efficiency of the heat exchanger.

BACKGROUND OF THE INVENTION

An air-cooled fin-type heat exchanger is very well known. Heat exchangers are used for changing the temperature of various working fluids, such as an engine coolant, an engine lubricating oil, an air conditioning refrigerant, and an automatic transmission fluid, for example. The heat exchanger typically includes a plurality of spaced apart fluid conduits or tubes connected between an inlet tank and an outlet tank, and a plurality of heat exchanging fins disposed between adjacent conduits. Air is directed across the fins of the heat exchanger by a cooling fan or a motion of a vehicle, for example. As the air flows across the fins, heat in a fluid flowing through the tubes is conducted through the walls of the tubes, into the fins, and transferred into the air.

One of the primary goals in heat exchanger design is to achieve the highest possible thermal efficiency. Thermal efficiency is measured by dividing the amount of heat that is transferred by the heat exchanger under a given set of conditions (amount of airflow, temperature difference between the air and fluid, and the like) by the theoretical maximum possible heat transfer under those conditions. Thus, an increase in the rate of heat transfer under a given set of conditions results in a higher thermal efficiency.

Typically, to improve thermal efficiency, the airflow must be improved and/or a pressure drop through the heat exchanger must be reduced. Improved heat exchanger performance can be accomplished by forming the fins and/or louvers on the fins at a predetermined angle in a manner also well known in the art. Pressure drop is associated with the change in airflow direction caused by the louvered fins. A higher air pressure drop can result in a lower heat transfer rate. Various types of fin and louver designs have been disclosed in the prior art with the object of increasing the heat exchanger efficiency by making improvements in the fins, louvers, and airflow pattern.

Examples of these prior art fin and louver designs include an addition of fin rows in order to increase the amount of air encountered by the heat exchanger. Other designs include louvers formed at an angle to the fin wall, rather than square to the fin wall. Further, the prior art discloses heat exchangers with multiple changes of airflow direction. Air flows through the louvers until a middle transition piece or turnaround rib is reached. The air then changes direction and flows through exit louvers to exit the heat exchanger. Fin design continues to play an important role in increasing heat exchanger efficiency.

A thermoelectric device can be used to transfer heat between fluids, such as from air flow to a fluid in a fluid conduit, for example. The thermoelectric device includes a hot side and a cold side, wherein one of the hot side and the cold side is in communication with each of the fluids. A heat transfer efficiency of the thermoelectric device decreases as a difference in temperature between the hot side and the cold side thereof increases.

It would be desirable to produce a tube for a heat exchanger having an integrated thermoelectric device whereby a thermal efficiency of the heat exchanger is maximized.

SUMMARY OF THE INVENTION

Harmonious with the present invention, a tube for a heat exchanger having an integrated thermoelectric device whereby a thermal efficiency of the heat exchanger is maximized has surprisingly been discovered.

In one embodiment, a tube for a heat exchanger comprises a hollow conduit having a wall, a first end, and a spaced apart second end; and a thermoelectric device in thermal communication with the wall of the conduit to facilitate heat transfer between a first fluid in the conduit and a second fluid outside of the conduit.

In another embodiment, a heat exchanger comprises at least one heat exchanger tank; a hollow tube having a wall, a first end, and a spaced apart second end, the tube in fluid communication with the at least one heat exchanger tank; a thermoelectric device in thermal communication with the wall of the tube; and a heat exchanger fin in thermal communication with the thermoelectric device.

In another embodiment, a heat exchanger comprises at least one heat exchanger tank; a plurality of hollow tubes, each tube having a wall, a first end, and a spaced apart second end, the tubes in fluid communication with the at least one heat exchanger tank and adapted to convey a first fluid; a plurality of heat exchanger fins disposed adjacent the tubes and in thermal communication with a second fluid; and a plurality of thermoelectric devices, at least one thermoelectric device disposed between the tubes and the fins to facilitate heat transfer therebetween.

BRIEF DESCRIPTION OF THE DRAWINGS

The above, as well as other objects and advantages of the invention, will become readily apparent to those skilled in the art from reading the following detailed description of a preferred embodiment of the invention when considered in the light of the accompanying drawings in which.

DETAILED DESCRIPTION OF THE PREFERRED EMBODIMENT

The following detailed description and appended drawings describe and illustrate various exemplary embodiments of the invention. The description and drawings serve to enable one skilled in the art to make and use the invention, and are not intended to limit the scope of the invention in any manner.

Figure 1:
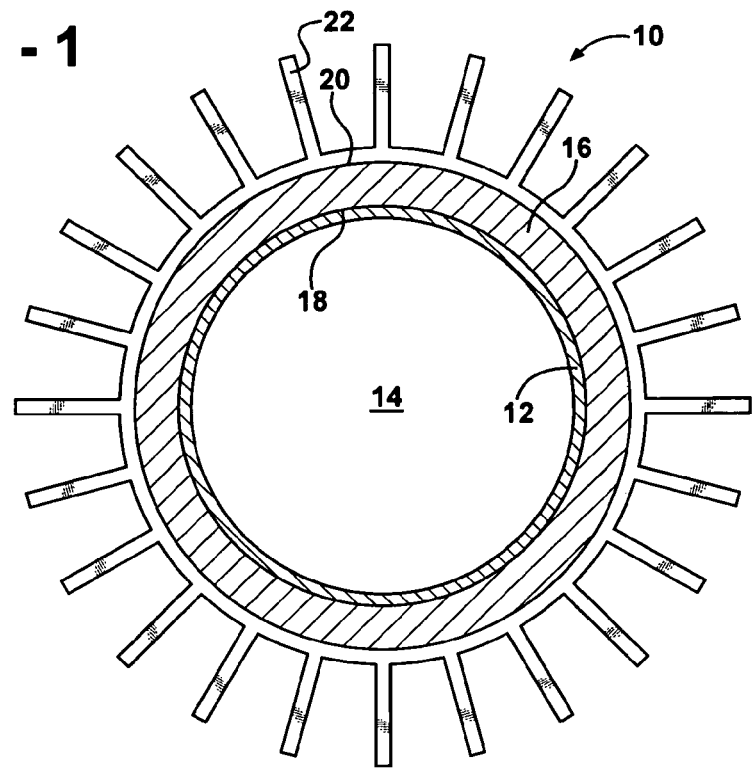
FIG. 1 is an end sectional view of a tube for a heat exchanger in accordance with an embodiment of the invention.
Figure 2:
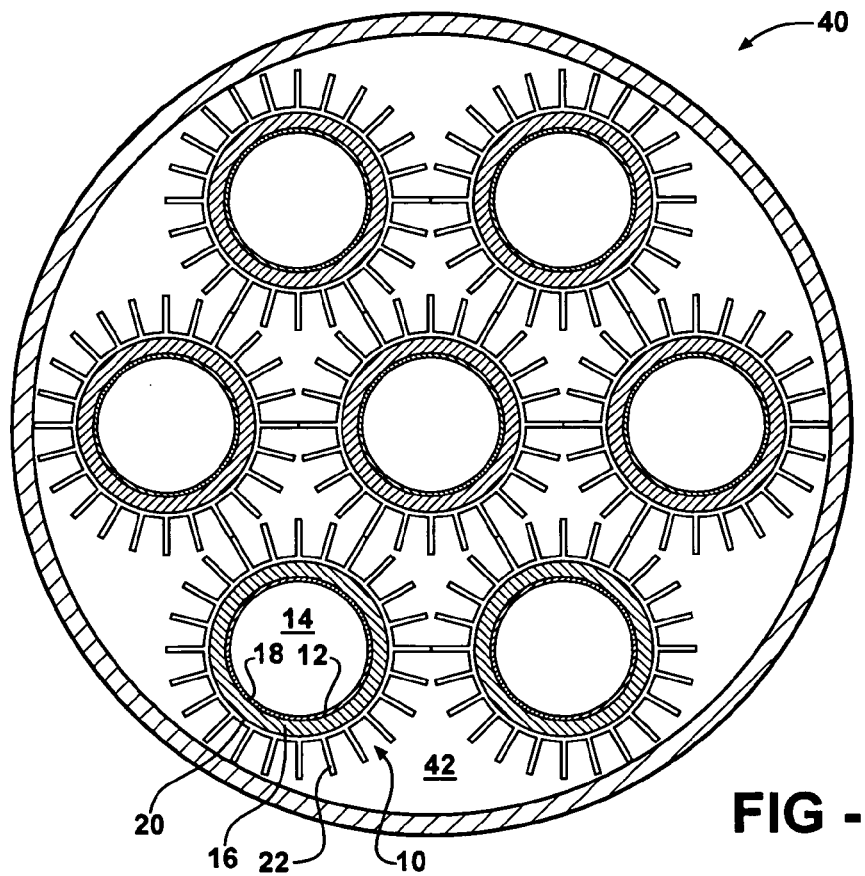
FIG. 2 is an end sectional view a heat exchanger using the tube of FIG. 1.

FIG. 1 shows a cylindrical tube 10 for a heat exchanger 40 illustrated in FIG. 2. The tube 10 has an outer wall 12 with a substantially circular cross-sectional shape. Other cross-sectional shapes can be used as desired. The wall 12 is preferably formed from copper or steel; however, other materials may be used to form the wall 12 without departing from the scope and spirit of the invention. The wall 12 forms a hollow interior portion 14.

A thermoelectric device (TED) 16 surrounds and is in thermal communication with the wall 12. The TED 16 includes a first heat transfer surface 18 and a second heat transfer surface 20. The first heat transfer surface 18 is in thermal communication with the wall 12. The second heat transfer surface 20 is in thermal communication with a plurality of fins 22 surrounding the TED 16.

The TED 16 is in electrical communication with a control system (not shown). The control system controls an electric current sent to the TED 16. When a current is delivered in one direction, one of the first heat transfer surface 18 and the second heat transfer surface 20 generates thermal energy and the other of the first heat transfer surface 18 and the second heat transfer surface 20 absorbs thermal energy. When the current is reversed, the one of the first heat transfer surface 18 and the second heat transfer surface 20 which was generating thermal energy now absorbs thermal energy, and the other of the first heat transfer surface 18 and the second heat transfer surface 20 now generates thermal energy. When the current is increased, a heating and cooling capacity of the TED 16 is increased. Likewise, when the current is decreased, the heating and cooling capacity of the TED 16 is decreased.

The TED 16 may be any conventional device such as: those produced by Marlow Industries, Inc. of Dallas, Tex.; the thermoelectric systems described in U.S. Pat. No. 6,539,725 to Bell; a quantum tunneling converter; a Peltier device; a thermo ionic module; a magneto caloric module; an acoustic heating mechanism; a solid state heat pumping device; and the like; for example; or any combination of the devices listed above. Although a single thermoelectric device is shown, it is understood that additional thermoelectric devices can be used, as desired.

In use, a first fluid (not shown) is caused to flow through the hollow interior portion 14 of the tube 10. The first fluid can be any conventional fluid such as air or a coolant such as a water-glycol coolant, for example. The first fluid contains thermal energy which is transferred to the wall 12. Current is supplied to the TED 16, which causes the first heat transfer surface 18 of the TED 16 to absorb thermal energy from the wall 12. Simultaneously, the second heat transfer surface 20 of the TED 16 generates thermal energy. The thermal energy generated by the second heat transfer surface 20 of the TED 16 is transferred to the fins 22. A second fluid (not shown) is caused to flow across and contact the fins 22. The second fluid can be any conventional fluid such as air, for example. The thermal energy transferred from the second heat transfer surface 20 of the TED 16 to the fins 22 is transferred to the second fluid.

Figure 3:
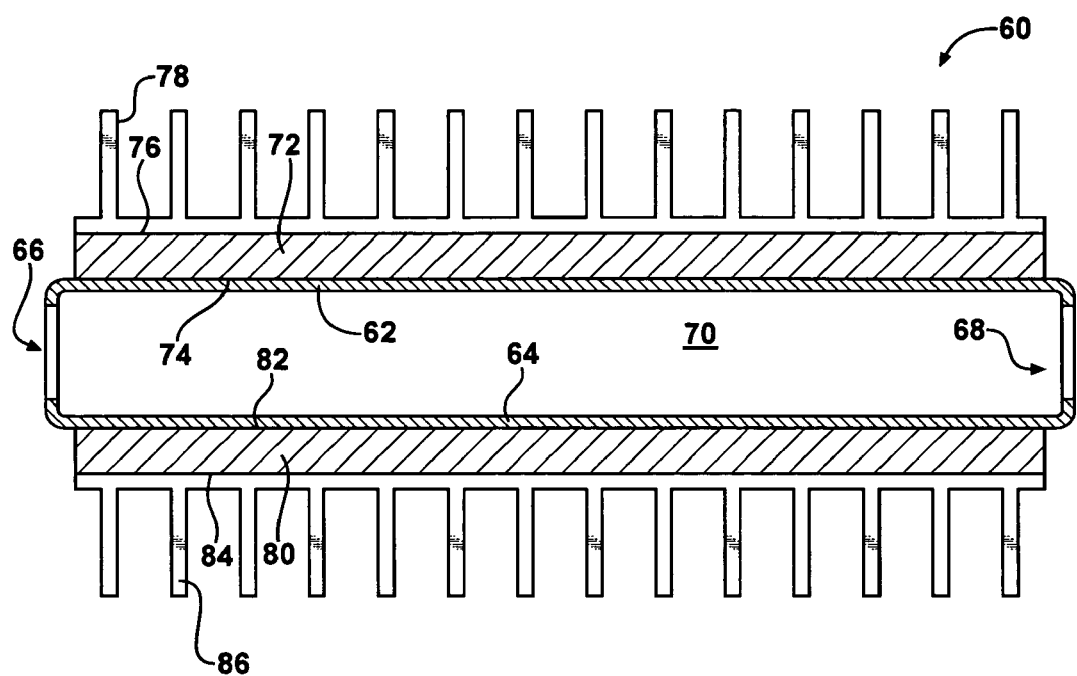
FIG. 3 is a side sectional view of a tube for a heat exchanger in accordance with another embodiment of the invention.

FIG. 3 shows a tube 60 for a heat exchanger (not shown) having a first wall 62, a second wall 64, a fluid inlet 66, and a fluid outlet 68. The tube 60 shown is a flat tube for use in a flat tube heat exchanger. However, tubes having other shapes and for use in other types of heat exchangers, such as cross flow heat exchangers, shell and tube heat exchangers, or counter flow heat exchangers, for example, can be used as desired without departing from the scope and spirit of the invention. The walls 62, 64 are preferably formed from copper or steel. However, other materials may be used to form the walls 62, 64 as desired. The first wall 62, the second wall 64, and a pair of side walls (not shown) cooperate to form a hollow interior portion 70.

A first thermoelectric device (TED) 72 is disposed adjacent to and is in thermal communication with the first wall 62. The first TED 72 includes a first heat transfer surface 74 and a second heat transfer surface 76. The first heat transfer surface 74 is in thermal communication with the first wall 62. The second heat transfer surface 76 is in thermal communication with a plurality of fins 78 disposed adjacent to the first TED 72.

A second thermoelectric device (TED) 80 is disposed adjacent to and is in thermal communication with the second wall 64. The second TED 80 includes a first heat transfer surface 82 and a second heat transfer surface 84. The first heat transfer surface 82 is in thermal communication with the second wall 64. The second heat transfer surface 84 is in thermal communication with a plurality of fins 86 disposed adjacent to the second TED 80.

The TEDs 72, 80 may be any conventional devices such as: those produced by Marlow Industries, Inc. of Dallas, Tex.; the thermoelectric systems described in U.S. Pat. No. 6,539,725 to Bell; a quantum tunneling converter; a Peltier device; a thermo ionic module; a magneto caloric module; an acoustic heating mechanism; a solid state heat pumping device; and the like; for example; or any combination of the devices listed above. Although two thermoelectric devices are shown, it is understood that a single or additional thermoelectric devices can be used, as desired. Further, it is understood that the side walls of the tube 60 may include additional TEDs if desired. If the side walls of the tube include additional TEDs, a plurality of fins can be disposed adjacent the TEDs as desired.

The first TED 72 and the second TED 80 are in electrical communication with a control system (not shown). The control system controls an electric current sent to the TEDs 72, 80. When a current is delivered in one direction, one of the first heat transfer surfaces 74, 82 and the second heat transfer surfaces 76, 84 generates thermal energy and the other of the first heat transfer surfaces 74, 82 and the second heat transfer surfaces 76, 84 absorbs thermal energy. When the current is reversed, the one of the first heat transfer surfaces 74, 82 and the second heat transfer surfaces 76, 84 which was generating thermal energy now absorbs thermal energy, and the other of the first heat transfer surfaces 74, 82 and the second heat transfer surfaces 76, 84 now generates thermal energy. When the current is increased, a heating and cooling capacity of the TEDs 72, 80 is increased. Likewise, when the current is decreased, the heating and cooling capacity of the TEDs 72, 80 is decreased.

In use, a first fluid (not shown) is caused to flow through the hollow interior portion 70 of the tube 60. The first fluid can be any conventional fluid such as air or a coolant such as a water-glycol coolant, for example. The first fluid contains thermal energy which is transferred to the first wall 62 and the second wall 64. Current is supplied to the TEDs 72, 80, which causes the first heat transfer surfaces 74, 82 of the TEDs 72, 80 to absorb thermal energy from the first wall 62 and the second wall 64. Simultaneously, the second heat transfer surfaces 76, 84 of the TEDs 72, 80 generate thermal energy. The thermal energy generated by the second heat transfer surfaces 76, 84 of the TEDs 72, 80 is transferred to the fins 78, 86. A second fluid (not shown) is caused to flow across and contact the fins 78, 86. The second fluid can be any conventional fluid such as air, for example. The thermal energy transferred from the second heat transfer surfaces 76, 84 of the TEDs 72, 80 to the fins 78, 86 is transferred to the second fluid.

Figure 4:
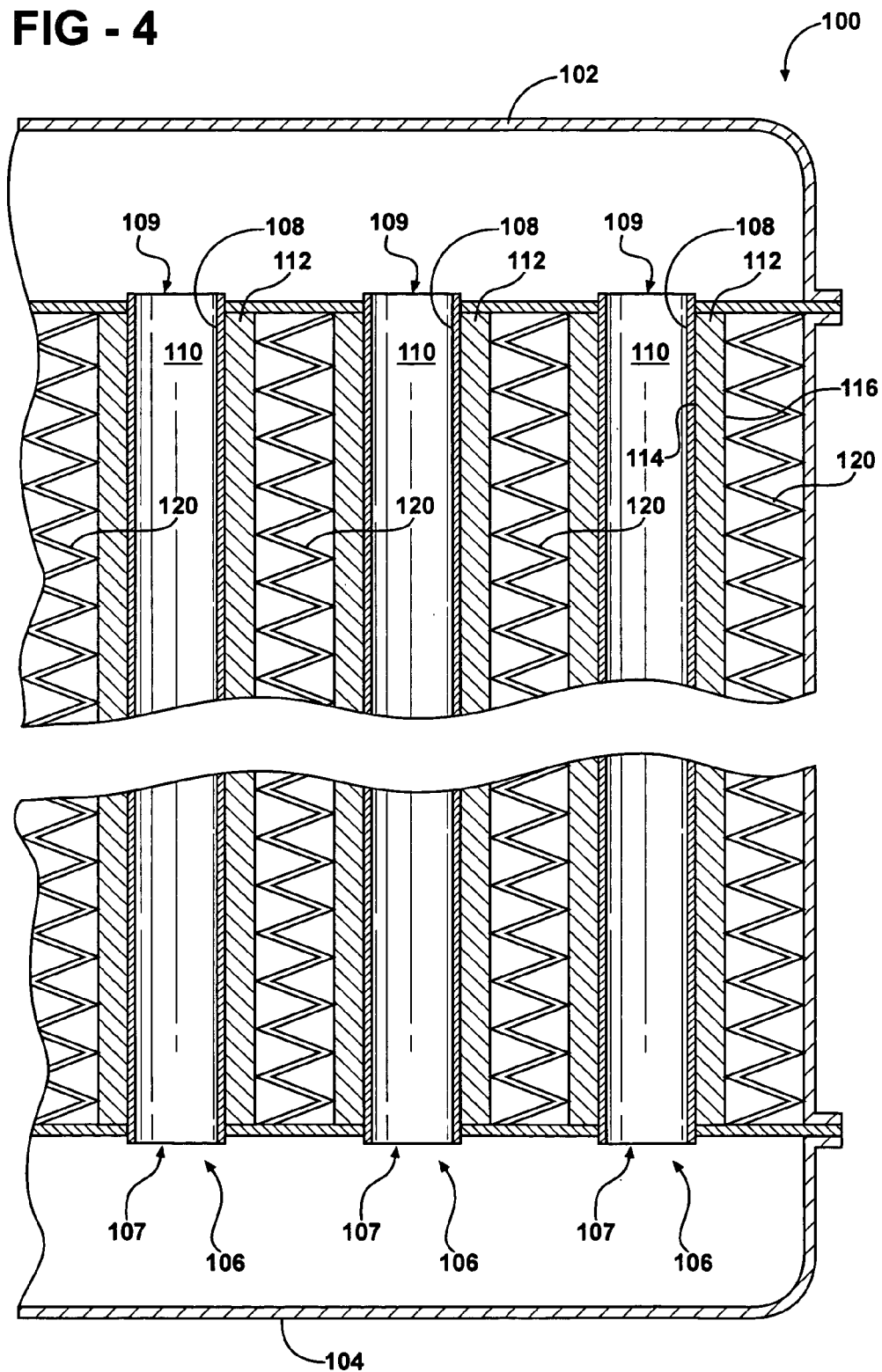
FIG. 4 is a front sectional view of a heat exchanger in accordance with another embodiment of the invention.

FIG. 4 shows a heat exchanger 100 in accordance with another embodiment of the invention. The heat exchanger 100 includes a first header 102 and a spaced apart second header 104. A plurality of cylindrical tubes 106 are disposed between the first header 102 and the second header 104. The tubes have walls 108 with a substantially circular cross-sectional shape. Other cross-sectional shapes can be used as desired. The walls 108 are preferably formed from copper or steel. However, other materials may be used to form the walls 108 without departing from the scope and spirit of the invention. The walls 108 form hollow interior portions 110 and include a fluid inlet 107 and a fluid outlet 109.

A thermoelectric device (TED) 112 surrounds and is in thermal communication with each of the walls 108. Each TED 112 includes a first heat transfer surface 114 and a second heat transfer surface 116. The first heat transfer surface 114 is in thermal communication with the wall 108 of the corresponding tube 106. The second heat transfer surface 116 is in thermal communication with a plurality of fins 120 disposed between each adjacent tube 106.

Each TED 112 is in electrical communication with a control system (not shown). The control system controls an electric current sent to the TED 112. When a current is delivered in one direction, one of the first heat transfer surface 114 and the second heat transfer surface 116 generates thermal energy and the other of the first heat transfer surface 114 and the second heat transfer surface 116 absorbs thermal energy. When the current is reversed, the one of the first heat transfer surface 114 and the second heat transfer surface 116 which was generating thermal energy now absorbs thermal energy and the other of the first heat transfer surface 114 and the second heat transfer surface 116 now generates thermal energy. Additionally, when the current is increased, a heating and cooling capacity of the TED 112 is increased. Likewise, when the current is decreased, the heating and cooling capacity of the TED 112 is decreased.

The TEDs 112 may be any conventional devices such as: those produced by Marlow Industries, Inc. of Dallas, Tex.; the thermoelectric systems described in U.S. Pat. No. 6,539,725 to Bell; a quantum tunneling converter; a Peltier device; a thermo ionic module; a magneto caloric module; an acoustic heating mechanism; a solid state heat pumping device; and the like; for example; or any combination of the devices listed above. Although a single thermoelectric device is shown disposed adjacent each of the tubes 106, it is understood that additional thermoelectric devices can be used, as desired.

In use, a first fluid (not shown) is caused to flow from the second header 104 through the fluid inlets 107 into the hollow interior portions 110 of the tubes 106. The first fluid can be any conventional fluid such as air or a coolant such as a water-glycol coolant, for example. The first fluid contains thermal energy which is transferred to the walls 108. Current is supplied to each TED 112, which causes the first heat transfer surface 114 of each TED 112 to absorb thermal energy from the wall 108 of the corresponding tube 106. Simultaneously, the second heat transfer surface 116 of each TED 112 generates thermal energy. The thermal energy generated by the second heat transfer surface 116 of each TED 112 is transferred to the fins 120. A second fluid (not shown) is caused to flow across and contact the fins 120. The second fluid can be any conventional fluid such as air, for example. The thermal energy transferred from the second heat transfer surface 116 of each TED 112 to the fins 120 is transferred to the second fluid. The first fluid flows out of the fluid outlets 109 and into the first header 102.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. A heat exchanger comprising: at least one heat exchanger tank; a plurality of hollow tubes, each of the plurality of tubes having a wall, a first end, and a spaced apart second end, wherein each of the plurality of tubes is in fluid communication with the at least one heat exchanger tank; at least a first header connected to the first end of each of the plurality of the hollow tubes; at least a second header connected to the second end of each of the plurality of the hollow tubes; at least the second header spaced apart from at least the first header; a plurality of thermoelectric devices configured such that each of the walls of the plurality of tubes is in thermal communication with at least one of the plurality of thermoelectric devices; a plurality of heat exchanger fins configured such that at least one of the plurality of fins is configured such that a first end of the at least one of the plurality of fins is in thermal communication with at least a first one of the plurality of thermoelectric devices and a second end opposite the first end is in thermal communication with at least a second one of the plurality of thermoelectric devices; and a control system in electrical communication with the plurality of thermoelectric devices, the control system configured to control the magnitude of an electric current delivered to the plurality of thermoelectric devices in order to select a heating and cooling capacity of the plurality of thermoelectric devices.

2. The heat exchanger defined in claim 1, wherein at least one of the plurality of thermoelectric devices is disposed around the wall of at least one of the tubes.

3. The heat exchanger defined in claim 1, wherein a first heat transfer surface of each of the plurality of thermoelectric devices is in thermal communication with at least one of the tubes and a second heat transfer surface of each of the plurality of thermoelectric devices is in thermal communication with at least one of the plurality of heat exchanger fins.

4. The heat exchanger defined in claim 1, wherein a first fluid is a liquid and a second fluid is a gas, and the first fluid and the second fluid are configured to convey in the heat exchanger.

5. The heat exchanger defined in claim 1, wherein the heat exchanger is a flat tube heat exchanger.

6. The heat exchanger defined in claim 1, wherein the heat exchanger is a cross flow heat exchanger.

7. The heat exchanger defined in claim 1, wherein the heat exchanger is a shell and tube heat exchanger.

8. The heat exchanger defined in claim 1, wherein the heat exchanger is a counter flow heat exchanger.

9. A heat exchanger comprising: at least one heat exchanger tank having at least one hollow conduit configured to convey a second fluid; a plurality of hollow tubes, each tube having a wall, a first end, and a spaced apart second end, the tubes in fluid communication with the at least one heat exchanger tank and adapted to convey a first fluid, wherein the plurality of hollow tubes is within the at least one hollow conduit of the at least one heat exchanger tank; at least a first header connected to the first end of each of the plurality of the hollow tubes; at least a second header connected to the second end of each of the plurality of the hollow tubes; at least the second header spaced apart from at least the first header; a plurality of heat exchanger fins disposed adjacent the tubes and in thermal communication with the second fluid; a plurality of thermoelectric devices, at least one thermoelectric device disposed between the tubes and the fins to facilitate heat transfer between the first fluid and the second fluid; and a control system in electrical communication with the at least one thermoelectric device, the control system configured to control the direction of an electric current delivered to the at least one thermoelectric device in order to select between a first mode, in which thermal energy is transferred from the first fluid to the second fluid, and a second mode, in which thermal energy is transferred from the second fluid to the first fluid.

10. The heat exchanger defined in claim 9, wherein the thermoelectric devices are disposed around the walls of the tubes.

11. The heat exchanger defined in claim 9, wherein the fins extend radially outwardly from outer surfaces of the thermoelectric devices.

12. The heat exchanger defined in claim 9, wherein the first fluid is a liquid and the second fluid is a gas.

13. The heat exchanger defined in claim 9, wherein a first heat transfer surface of each thermoelectric device is in thermal communication with at least one of the tubes and a second heat transfer surface of each thermoelectric device is in thermal communication with at least one of the heat exchanger fins.

14. The heat exchanger defined in claim 9, wherein the heat exchanger tank is one of a flat tube heat exchanger, a cross flow heat exchanger, a shell and tube heat exchanger, and a counter flow heat exchanger.

15. The heat exchanger defined in claim 1, wherein the control system is configured to control the direction of the electric current delivered to the plurality of thermoelectric devices in order to select between a first mode, in which thermal energy is transferred from the wall to the heat exchanger fin, and a second mode, in which thermal energy is transferred from the heat exchanger fin to the wall.

16. The heat exchanger defined in claim 9, wherein the control system is configured to control the magnitude of the electric current delivered to the at least one thermoelectric device in order to select a heating and cooling capacity of the at least one thermoelectric device.

* * * * *